United States Patent
Goss

(10) Patent No.: US 7,042,294 B2
(45) Date of Patent: May 9, 2006

(54) POWER AMPLIFIER SYSTEM

(75) Inventor: Martin Goss, Cleckheaton (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/655,537

(22) Filed: Sep. 5, 2003

(65) Prior Publication Data

US 2004/0201422 A1    Oct. 14, 2004

(30) Foreign Application Priority Data

Sep. 6, 2002    (GB) .................................. 0220800.7

(51) Int. Cl.
*H03F 3/04*    (2006.01)
(52) U.S. Cl. ....................... 330/302; 330/306
(58) Field of Classification Search ................ 330/302, 330/303, 306, 285, 296, 277, 286
See application file for complete search history.

(56) References Cited

U.S. PATENT DOCUMENTS

| | | | |
|---|---|---|---|
| 5,272,450 A | 12/1993 | Wisherd | |
| 5,276,406 A * | 1/1994 | Samay et al. | 330/277 |
| 5,357,213 A | 10/1994 | Michel et al. | |
| 6,236,274 B1 * | 5/2001 | Liu | 330/302 |
| 6,346,859 B1 | 2/2002 | Saitou | |
| 6,737,923 B1 * | 5/2004 | Yamamoto et al. | 330/302 |

FOREIGN PATENT DOCUMENTS

GB    2 322 495 A    8/1998

* cited by examiner

*Primary Examiner*—Henry Choe
(74) *Attorney, Agent, or Firm*—Squire, Sanders & Dempsey L.L.P.

(57) ABSTRACT

A power amplifier comprising input means for receiving signals at a plurality of different frequencies; a power transistor for amplifying received signals; first circuitry connected at one end to said power transistor and at another end to a relatively low frequency shorting circuitry, said first circuitry being such that said another end is an open circuit to said different frequencies, said first circuitry having a length which is substantially less than a quarter wavelength of said different frequencies.

23 Claims, 6 Drawing Sheets

POWER AMPLIFIER SYSTEM

BACKGROUND OF THE INVENTION

1. Field of the Invention

The present invention relates to a power amplifier system and in particular but not exclusively to a power amplifier system for use in a communications system such as a wireless telecommunication system.

2. Description of the Related Art

An area covered by a cellular telecommunications network is divided into a plurality of cells. Each of these cells has a base station arranged to transfer signals to and receive signals from mobile stations located in the cell associated with the respective base station. Mobile stations will be in general in communication with a base station associated with the cell in which the mobile station is located.

A modulation system has been developed for use within a cellular network using the global system for mobile communication (GSM) standard which enhances the rate at which data is transferred between the mobile stations and base stations. This modulation scheme is called enhanced data rate for GSM evolution or EDGE modulation. EDGE modulation is a known modulation scheme so will not be explained in detail hereinafter. It is sufficient to note that EDGE modulation modulates digital data using both phase and amplitude information. To reduce errors at the receiver, the transmitted signal is similar to the modulated signal. Therefore the phase and amplitude errors introduced between the edge modulator and the transmitting antenna should be kept to a minimum.

Work is currently been carried out on a third generation cellular telecommunications standard. It is proposed that the third generation standard use code division multiple access in the radio domain between the mobile station and the base station. In one proposal, wide band CDMA is being proposed. Again, CDMA is a relatively complex modulation scheme, which allows higher data rates to be achieved.

However, these modulation schemes are relatively complex. In order to provide the higher data rate, this puts higher constraints on the radio frequency circuitry and in particular the power amplifier. In particular, there are two issues which need to be addressed: firstly, the peak powers of fluctuating envelope and secondly, linearity. The fluctuating envelope has two main effects on the power amplifier performance. The average power, that which defines the power dissipated in the power amplifier, is forced to run back from the maximum power of the power amplifier (this is referred to as power amplifier back off). This is disadvantageous because the maximum power is the most efficient operating point for the power amplifier. The reason why the average power has to run back from the maximum power is because of the peak to average ratio of the modulated signal. In more detail, there will generally be a linear region for the power amplifier where there is a linear relationship between the input signal power and the output signal power. This is for lower input signal powers. Generally, the power amplifier should be operated in the linear region in order to reduce intermodulation distortion. However, as the input signal power increases, the amplifier starts operating non-linearly beyond the linear region. This point is generally the point where the power amplifier is most efficient.

The fluctuating envelope signal is going to exacerbate the non-linearity of the power amplifier producing large inter-modulation products. This results in the power amplifier having to be backed off even further than required by the first point mentioned above. This makes the power amplifier even less efficient. In fact, this can result in the power amplifier, in some situations, never being capable of meeting linearity requirements on its own. Hence, power amplifiers have linearisation schemes bolted onto them so that only the average power determines how much the power amplifier needs to be backed off. There are many different examples of linearisation schemes. One example is digital predistortion where the input signal to the power amplifier is distorted digital at base band so that once it passes through the power amplifier, following up conversion, any intermodulation products produced by the power amplifier are cancelled.

However, power amplifier characteristics become more complicated when predistortion linearisation is used. One problem is the so-called memory effect. This occurs where intermodulation products generated by the power amplifier are not symmetrical about the carriers, in both amplitude and phase. Power amplifiers with significant memory effects require the predistortion signal applied to the input must also contain the same memory characteristics. In other words, the signals which are provided to the power amplifier to cancel the inter-modulation products are not symmetrical in terms of amplitude and phase about the carriers. This means that the circuitry for generating the predistortion linearisation can be complicated. This can also limit the extent to which the system will cancel the unwanted intermodulation products.

It should be appreciated that this problem is exacerbated when dealing with high bandwidth systems. Indeed, the digital predistortion systems are generally limited in the bandwidth of the predistortion signal that they can produce.

SUMMARY OF THE INVENTION

It is an aim of embodiments of the present invention to address or at least mitigate at least one of the problems described above.

According to a first aspect of the invention, there is provided a power amplifier comprising: input means for receiving signals at a plurality of different frequencies; a power transistor for amplifying received signals; first circuitry connected at one end to said power transistor and at another end to a relatively low frequency shorting circuitry, said first circuitry being such that said another end is an open circuit to said different frequencies, said first circuitry having a length which is substantially less than a quarter wavelength of said different frequencies.

According to a second aspect of the present invention, there is provided an integrated circuit comprising input means for receiving a signals at a plurality of different frequencies; a power transistor for amplifying received signals; first circuitry connected at one end to said power Transistor and at another end to a relatively low frequency shorting circuitry, said first circuitry being such that said another end is an open circuit to said different frequencies, said first circuitry having a length which is substantially less than a quarter wavelength of said different frequencies.

BRIEF DESCRIPTION OF DRAWINGS

For a better understanding of the present invention and as to how the same may be carried into effect, reference will now be made by way of example only to the accompanying drawings in which.

DETAILED DESCRIPTION OF THE PREFERRED EMBODIMENTS

Figure 1:
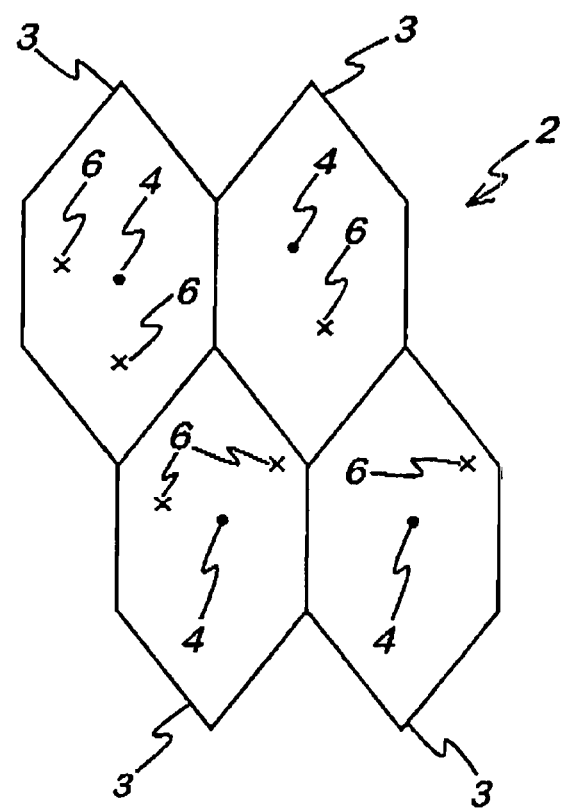
FIG. 1 shows a typical cell layout of a cellular network.

Reference is made to FIG. 1, which shows part of the cellular telecommunications network in which embodiments of the present invention can be implemented. The area 2 covered by the network is divided into a plurality of cells 3, four of which are shown in FIG. 1. Each cell 3 has associated there with a base transceiver station 4. The base transceiver stations 4 are arranged to communicate with mobile terminals 6 located in the cells associated with the given base station.

The mobile terminals can be user equipment. The user equipment can take any suitable format and can for example be mobile stations, mobile telephones, computers, lap top computers, personal digital assistants (PDA), organisers or the like.

Embodiments of the present invention can be used in any telecommunications situation. However, embodiments of the present invention are particularly advantageous when applied to modulation systems having a relatively high data rate such as multi-carrier or wideband CDMA or any multi-carrier signal. Embodiments of the present invention are particularly applicable to radio frequency signals. However, embodiments of the present invention can be used with signals having frequency other than radio frequencies.

Figure 3:
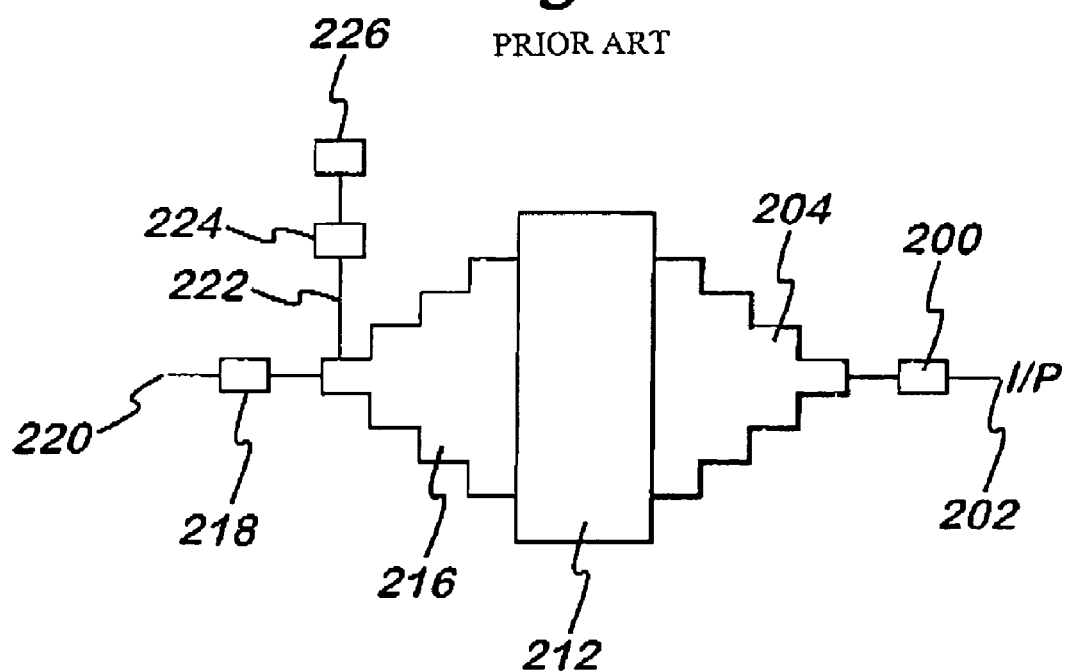
FIG. 3 shows the main components of a known power amplifier.
Figure 5:
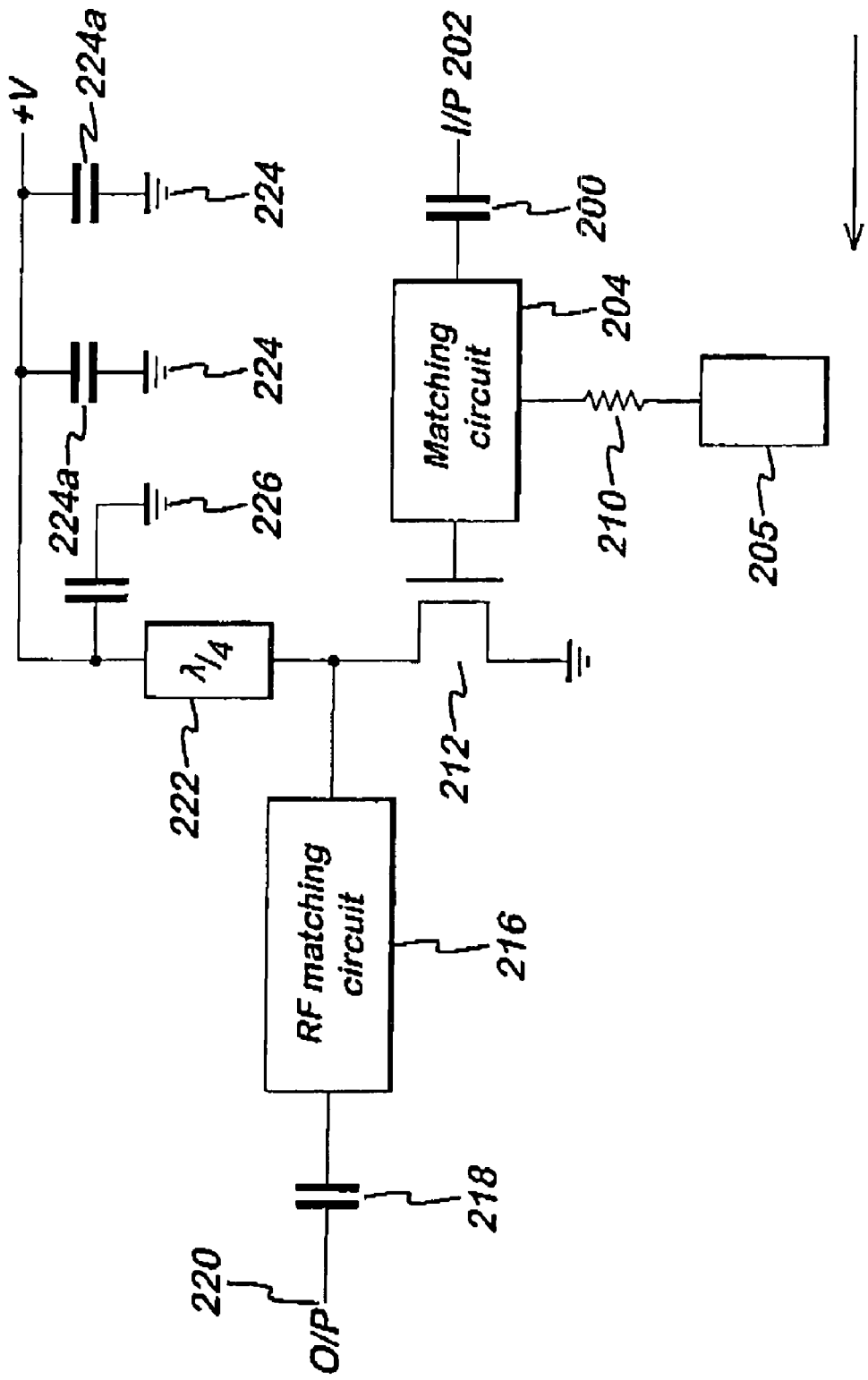
FIG. 5 shows the circuit diagram associated with the arrangement of FIG. 3.

Reference is made to FIG. 3 and FIG. 5, which show a power amplifier embodying the present invention. The power amplifier has an input 202, which receives the signal to be amplified, and an output 220, which outputs the amplified signal. The input signal is input to an input capacitor 200 the output of which is connected to a matching circuit 204. As can be seen from FIG. 5, the matching circuit is connected to a gate/base bias circuit 205 via a resistor 210. The matching circuit 204 is connected to a power transistor 212. The input to the power transistor 212 is via the gate/base connection (depending on if the transistor is a MOSFET or bipolar transistor respectively. The matching circuit 204 is connected to the control node, that is gate or base, of the transistor 212. The transistor is connected to ground on the Source/Emitter terminal and provides an output to the output 220 from the Drain/Collector terminal. The end of the transistor 212 connected to the output 220 is connected to one end of a radio frequency matching circuit 216. The output of the radio frequency matching circuit is coupled to one side of an output capacitor 218, the other side of which provides the output 220.

Before describing the rest of the circuit, the theory behind the design of high power power amplifiers indicates that a short circuit to any low frequency components should be provided for optimum linearity. This was provided in the known circuits by placing capacitors after the DC feed network, which was generally a high inductance coil or quarter wavelength microstrip transmission line. This is to present a high impedance to radio frequencies and a through path for direct current DC. As can be seen from FIG. 5, this is provided by the output terminal of the power amplifier connected to a quarter wavelength transmission path 222. The other side of the quarter wavelength transmission path 222 is connected to radio frequency RF shorting capacitor 226, which is arranged between the output of the quarter wavelength path 222 and ground. Arranged in parallel with the radio frequency shorting capacitor 226 are two low frequency shorting capacitors 224a and b. The two low frequency shorting capacitors are also in parallel and are arranged between the output of the quarter wavelength path 222 and ground. A voltage supply +V is provided.

However, the inventor has found, particularly for wideband signals that the bias feed network between the power transistor and the shorting capacitors, that is the quarter wavelength path 222, is enough to degrade the low frequency short by 0.5 Ohms at 5 MHz. This is enough to cause significant degradation in linearity and cause electrical memory effects. It should be appreciated that capacitor 226 is arranged to provide a radio frequency short whilst capacitors 224 are arranged to provide a low frequency short.

Figure 4:
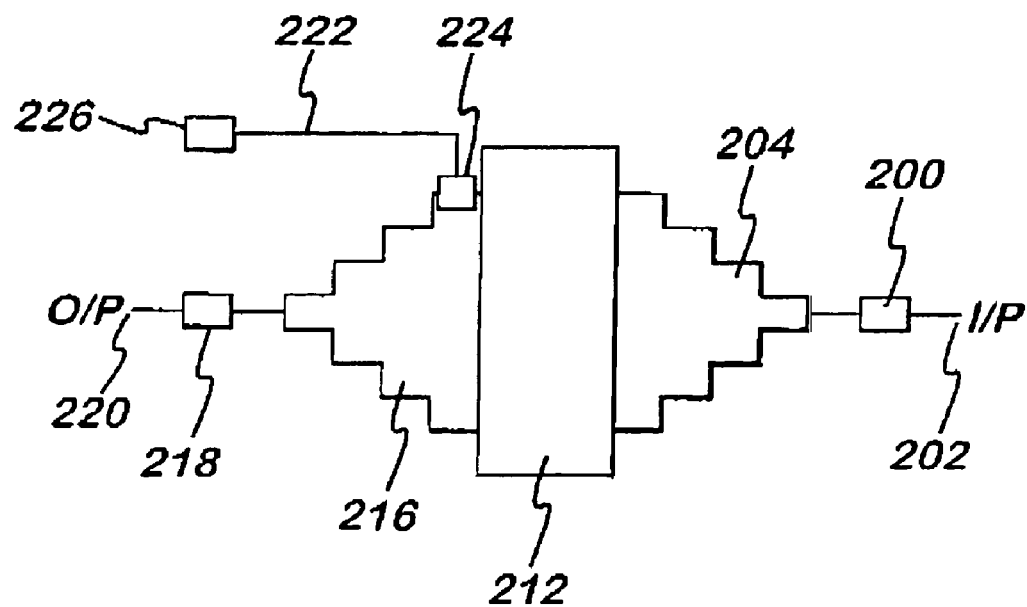
FIG. 4 shows a power amplifier embodying the present invention.
Figure 6:
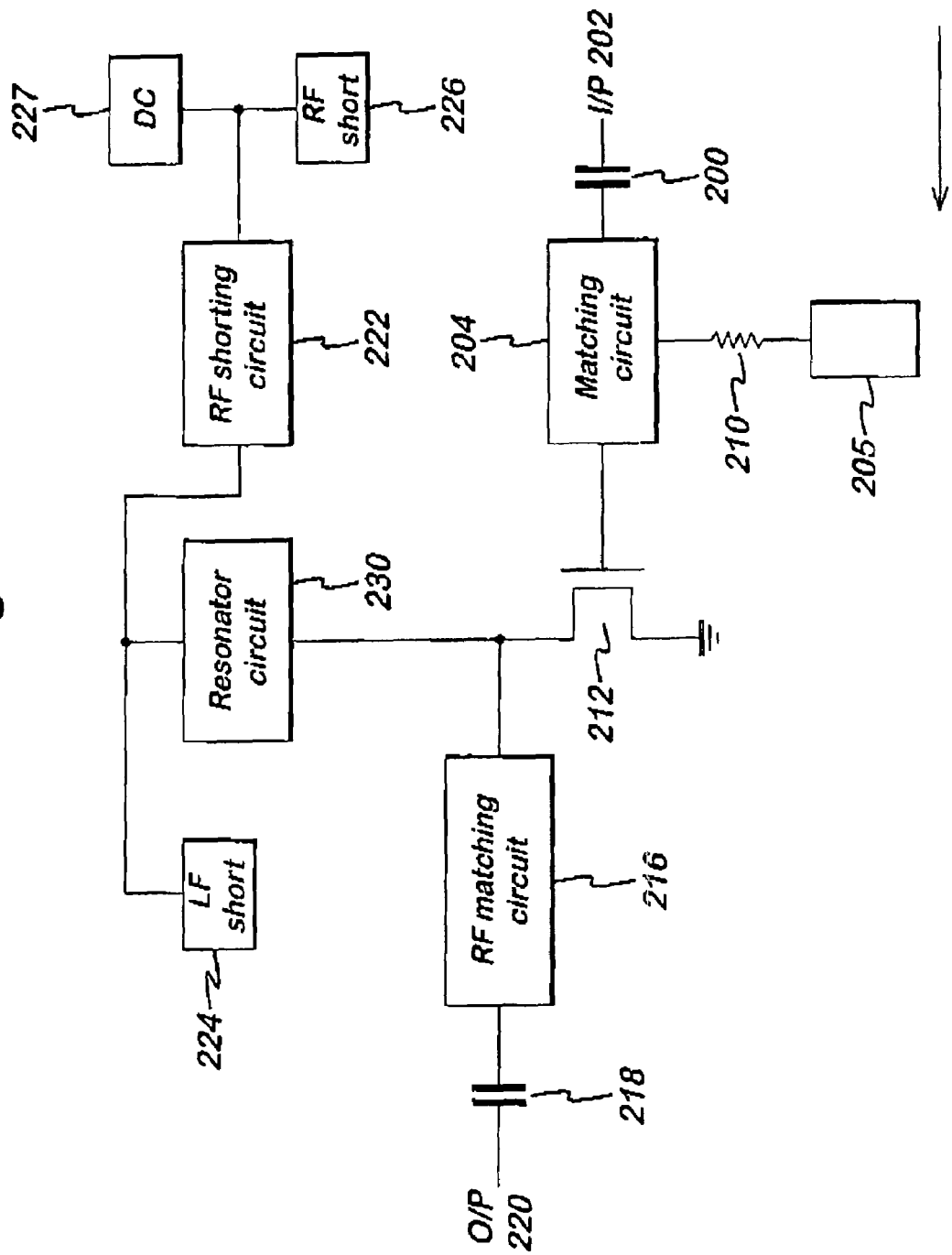
FIG. 6 shows the circuit diagram of the arrangement shown in FIG. 4.

Reference is now made to FIGS. 4 and 6, which show an embodiment of the present invention. Those elements which are the same as shown in FIG. 3 and 4 are marked using the same reference numbers. Thus, the input to the power amplifier transistor made up of the input capacitor 200, the matching circuit 204 and the resistor 210 are the same as shown in FIGS. 3 and 5. Likewise, the radio frequency matching circuit 216 and output capacitor 218 are the same as shown in FIGS. 3 and 5.

The drain/collector terminal of the power transistor 212 is connected to a resonator circuit 230. The other end of the resonator circuit 230 is connected to a low frequency short 224 and a quarter wavelength transmission path 222 which are arranged in parallel with each other. The quarter wavelength transmission path is connected to the DC supply 227 and also to the radio frequency short 226. It should be appreciated that the low frequency short 224 and the radio frequency short 226 may be capacitors as shown in FIGS. 3 and 5. The low frequency short is arranged to short circuit the low frequency signals at the transistor reference plane. It should also be appreciated that in embodiments of the present invention, the radio frequency quarter wavelength transmission path may be omitted. This is because the resonator circuit 230 may provide the necessary radio frequency isolation.

Previous solutions ignored the fact that a high radio frequency impedance DC feed circuit, used to isolate the radio frequency from the DC feed, can give enough impedance at low frequencies to degrade for example wideband signal linearity and increase the memory effects. Embodiments of the present invention are able to address this effect. Rather than use a quarter wave line, a band stop filter which has a short electrical length for an improved short at low frequency, is used. Additionally, the band stop filter is arranged to operate at radio frequencies. The band stop filter provides a low impedance path for low frequency components to get to the low frequency shorting capacitors while at the same time blocking DC to ground. This allows the low frequency shorting capacitors to be placed very close to the power transistors output terminal. In other words, in embodiments of the present invention the electrical length between the output of the power transistor and the shorting capacitors is significantly reduced and may for example be of the order of 0.10 to 0.25, preferably between 0.15 and 0.20 and for example 0.17 degree at signal envelope frequencies. Of course the smaller the value the better, and values below 0.10 can of course be used in embodiments of the invention. The term signal envelope frequency is explained later.

Figure 7:
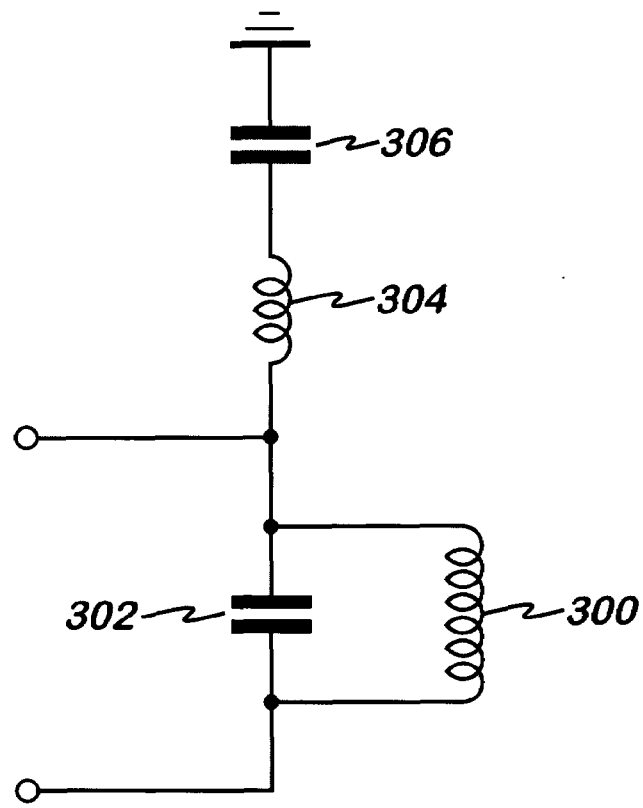
FIG. 7 shows a band stop filter for use in embodiments of the present invention.

Reference is made to FIG. 7 which shows one example of an band stop filter embodying the present invention. The band stop filter can take any suitable format. In preferred embodiments of the present invention, the band stop filter is arranged with a band stop covering the radio frequency operation of frequency of the power amplifier. The band stop filter preferably shows virtually a short circuit at the signal envelope frequencies that provide a DC open to ground. In one embodiment of this present invention, this can be achieved by using a parallel resonant LC circuit followed by a series LC circuit. In other words, a first inductor 300 is arranged in parallel with a first capacitor 302 to form a resonant circuit at the signal frequency. Arranged in series with the first capacitor 300 and first inductor 302 is a second inductor 304. Arranged in series with the second inductor 304 is a second capacitor 306, again to form a resonant circuit to the signal frequency. The L (inductance) has been kept as low as possible by increasing the value of the capacitance C. This allows a short section of thin microstrip to be used for the inductance. This can be part of the microstrip or connector which is used to solder the power transistor to the output matching circuit. This microstrip at the signal envelope frequencies, due to its short length which is typically less than 6 mm, presents virtually no series impedance/electrical length. The low frequency shorting capacitor 224 is then attached to the output of this filter and ground to present the required short.

In the described arrangement, the band pass filter is arranged externally from the power transistor. This is useful in those arrangements where the circuit is built from off the shelf components. However, improved performance may be achieved in embodiments of the present invention where the band pass filter is provided in the power transistor integrated circuit package. This is because embodiments of the present invention are more effective the closer the band stop filter is to the power transistor.

In some embodiments of the present invention, the end of the quarter wave line opposite to the RF shorting capacitor may be made so as to be as close as possible to the power transistor to improve performance.

Figure 9:
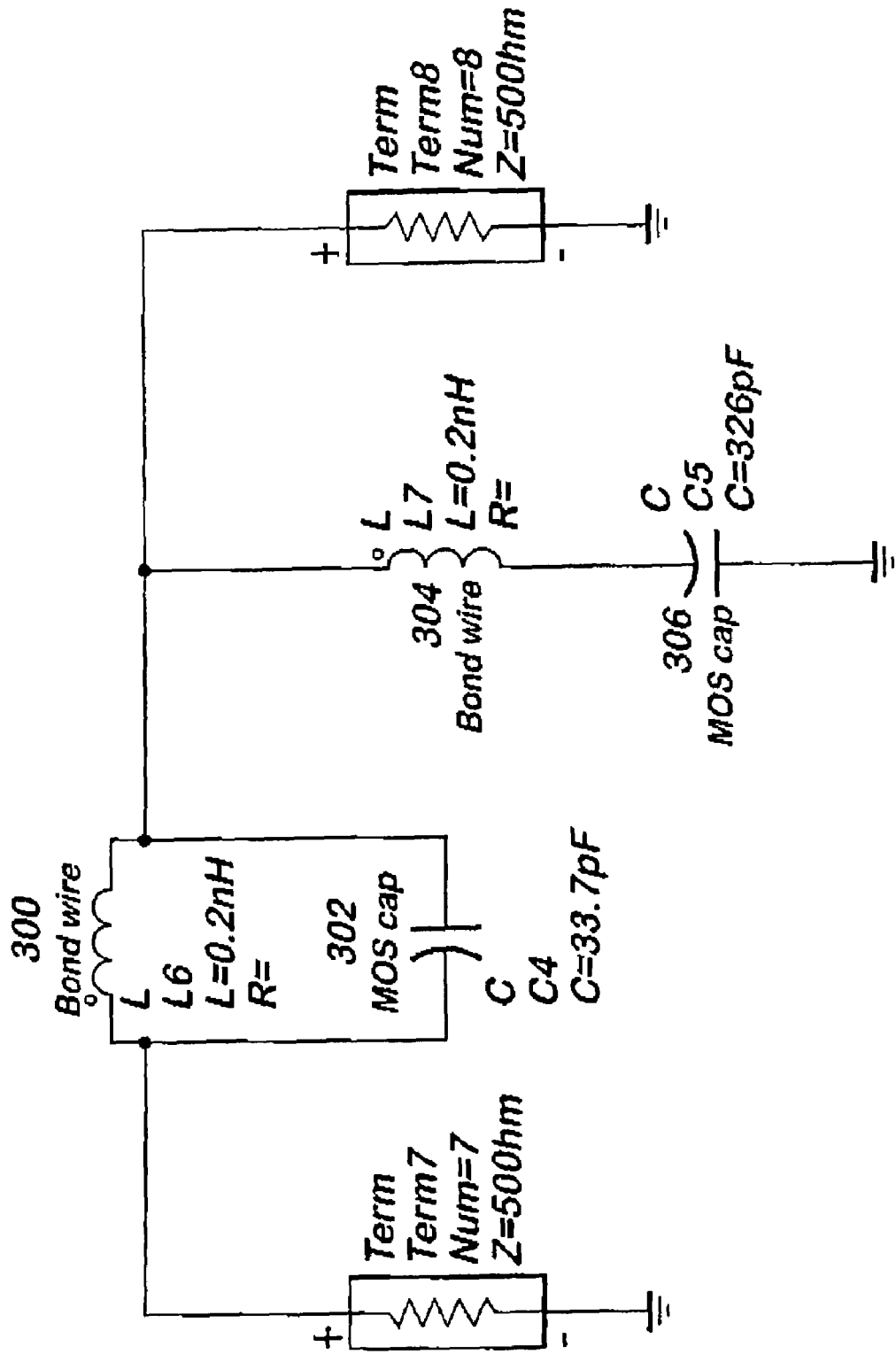
FIG. 9 shows an embodiment of the present invention incorporated in an integrated circuit.

Reference is made to FIG. 9, which shows embodiments of the present invention, which are incorporated in a transistor package. Effectively, embodiments of the invention will be implemented in a similar "electrical" manner. However, instead of using the arrangement as described in other embodiments of the present invention, bond wires can be used for one or both of the inductor. The inductance required is particularly suited to bond wires. Bond wires can of course also be used in arrangements where the band pass filter is outside the transistor. The inductor 300 is again arranged in parallel with the first resonator capacitor 302. The first inductor 300 and the first resonator capacitor 302 are arranged in series with a second inductor 304 and a second capacitor 306. In this example shown, the first resonator capacitor 304 has a value of 33.7 pF whilst the second resonator capacitor 306 has a value of 32.6 pF. The first inductor 300 has a value of 0.2 nA as does the second inductor 304 The power transistor would be connected to Term 7 (which is connected between ground and one end of the first inductor 300 and the low frequency shorting capacitor) to Term 8 (which is connected between the other end of the first inductor and ground, in parallel with the second inductor 304 and second capacitor 306) of FIG. 9.

The arrangement shown in FIG. 9 can achieve a low frequency impedance of 0.1 Ohms.

Figure 8:
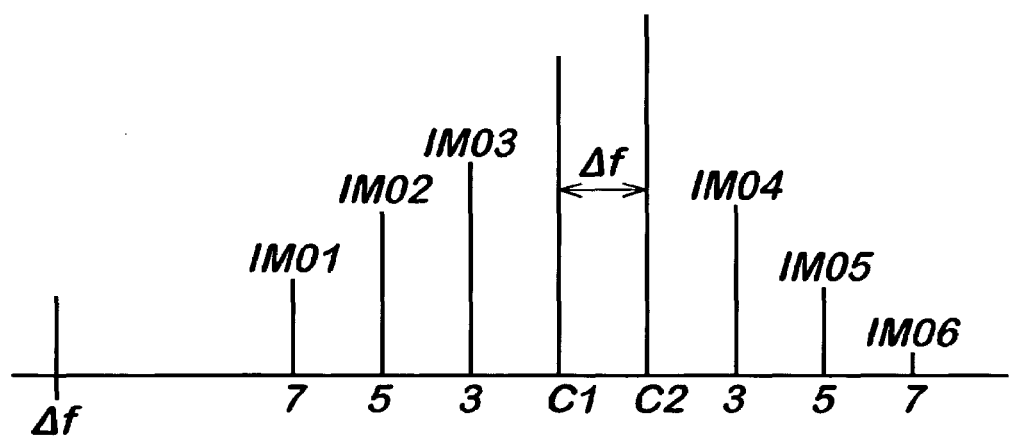
FIG. 8 illustrates the intermodulation product problem.

Reference is made to FIG. 8, which illustrates the problem which embodiments of the present invention seek to address. With wideband CDMA or indeed any system where there are more than one carrier frequencies, intermodulation memory effects may occur. FIG. 8 shows two carrier frequencies, which are marked as C1 and C2. These frequencies are separated by a difference of delta F. The difference between the two carrier frequencies gives rise to intermodulation products IMD 1–6 as is shown in FIG. 8. These intermodulation products are arranged around the carrier frequencies. However, as can be seen, the amplitude of the intermodulation products on each side of the carrier frequencies are not symmetrical, this is the same for the phase of the intermodulation products. Additionally, the frequency difference, delta F, between the carry frequencies C1 and C2 gives rise to a low frequency signal at delta F. It is for this reason that the low frequency short is required, to short this component out. Delta F is the envelope frequency.

Embodiments of the present invention are able to reduce the power amplifier memory effect. The amount of asymmetry in the intermodulation products is a function of a number of parameters such as modulation bandwidth or tone spacing, bias conditions and thermal effects, the most significant being the modulation bandwidth. Embodiments of the present invention are particularly concerned with eliminating or reducing the modulation bandwidth memory effects, sometimes known as electrical memory effects. Additionally, embodiments of the present invention are able to improve the power amplifier linearity. Simulations and practical results have shown that up to 10 dB improvements in the linearity for a two tone test of 6 MHz tone spacing can be achieved. 6 MHz is delta F in this case. Embodiments of the present invention are able to provide an improvement in the linearity and a higher power amplifier efficiency for equivalent intermodulation product performance. Additionally less power silicon may be required for equivalent intermodulation product performance, hence providing cheaper power amplifiers. By reducing the electrical memory effects, this can mean that a simpler digital predistortion algorithm can be used. This can simplify and make the circuits cheaper.

Figure 2:
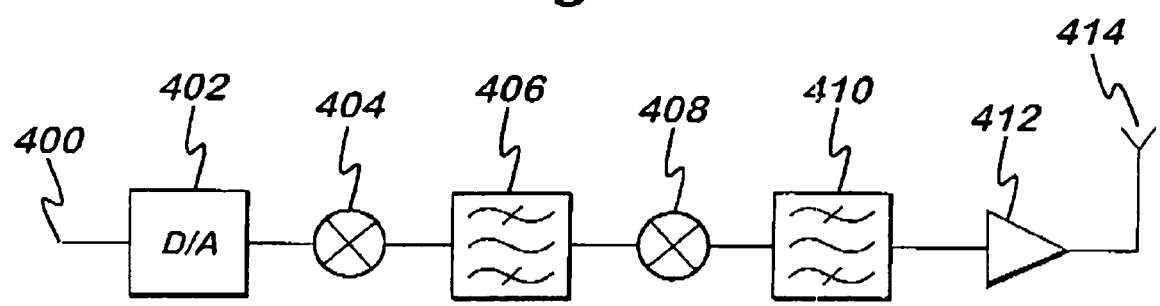
FIG. 2 shows a block diagram of a base transceiver station in which embodiments of the present invention can be incorporated.

FIG. 2 shows schematically a base station in which embodiments of the present invention can be used.

A signal to be transmitted is received at an input 400. The signal to be transmitted is input to a digital to analogue converter 402 which converts the signal from a digital form to an analogue form. The signal is then input to a first up converter 404 which up converts the signal from a base band frequency to a intermediate frequency. The signal is output by the up converter to a band pass filter 406 which filters the up converted signal. The filtered signal is input to a second up converter which converts the signal to a radio frequency. The radio frequency is then filtered by a second band pass filter 410. The filter signal is then amplified by amplifier 412. This is the amplifier of the amplifier system shown in FIG. 6. The amplified signal is then output to an antenna 414 for transmission.

In embodiments of the invention, one or more capacitors and/or one or more inductors may be provided by microstrips.

Embodiments of the present invention have been described in the context of EDGE and CDMA modulation schemes. However, embodiments of the invention can be used with any other modulation schemes. Embodiments of the present invention are particularly advantageous when used with modulation schemes with relatively high bandwidths such as 5 MHz or higher. Embodiments of the present invention are particularly advantageous when used with modulation schemes with relatively high data rates. However it should be appreciated that embodiments of the present invention can advantageously be used with embodiments of the invention where the data rate and/or the bandwidth is relatively low.

It should be appreciated that the diagram of FIG. 2 is highly schematic. Other components may be present. Additionally, amplifiers may be provided between the two up converters. The amplifiers may have the same construction as that described in relation to embodiments of the present invention. In alternative embodiments of the present invention, a single up converter may be used to convert the signal from the base band to radio frequency.

Embodiments of the present invention can also be used to amplify received signals.

Embodiments of the present invention have been described as being used in a base transceiver station. However, it should be appreciated that embodiments of the present invention can be used for example in user equipment.

It should also be appreciated that embodiments of the present invention can have wider application and can be used in any suitable situation. Embodiments of the present invention can for example be used in non cellular communication systems. Embodiments of the present invention can be used in satellite communication systems, military communications systems, one to one communication systems or any other system. Embodiments of the invention are particularly applicable to devices, systems, apparatus or the like with receive and/or transmit modulated radio signals.

The invention claimed is:

1. A power amplifier comprising:
 input means for receiving signals at a plurality of different frequencies;
 a power transistor for amplifying received signals;
 first circuitry connected at one end to said power transistor and at another end to a relatively low frequency shorting circuitry, said first circuitry being such that said another end is an open circuit to said different frequencies, said first circuitry comprising a short circuit at signal envelope frequencies thereby causing said first circuitry to have a length which is substantially less than a quarter wavelength of said different frequencies.

2. A system as claimed in claim 1, wherein said first circuitry has a length in the range of 0.10 to 0.25 degrees of a signal envelope frequency.

3. A system as claimed in claim 2, wherein said first circuitry has a length in the range of 0.15 to 0.20 degrees of a signal envelope frequency.

4. A system as claimed in claim 3, wherein said first circuitry has a length of about 0.17 degrees of a signal envelope frequency.

5. A system as claimed in claim 1, wherein said first circuitry comprises a band stop filter.

6. A system as claimed in claim 1, wherein said first circuitry comprises a least one resonant circuit.

7. A system as claimed in claim 6, wherein the at least one resonant circuit comprises an inductor and a capacitor.

8. A system as claimed in claim 7 wherein said inductor and said capacitor are arranged in series or in parallel.

9. A system as claimed in claim 8, wherein said first circuitry comprises a first resonant circuit having an inductor and capacitor in parallel and a second resonant circuit having a capacitor and inductor in series.

10. A system as claimed in claim 1, wherein said first circuitry provides a voltage feed path.

11. A system as claimed in claim 1, wherein said first circuitry has a relatively low impedance path for said relatively low frequency.

12. A system amplifier as claimed in claim 1, wherein said different frequencies are radio frequencies.

13. A system as claimed in claim 1, wherein said low frequency is of the order of a difference in frequency of said different frequencies.

14. A system as claimed in claim 1, wherein said plurality of frequencies are provided by one of multi-carrier modulation and relatively wide bandwidth modulation.

15. A system as claimed in claim 1, wherein said power amplifier transistor is provided in an integrated circuit.

16. A system as claimed in claim 1, wherein said first circuitry is at least partly provided in said integrated circuit.

17. A system as claimed in claim 16, wherein at least one inductor is provided by a bond wire.

18. A system as claimed in claim 1, wherein memory effects are reduced.

19. A system as claimed in claim 1, wherein said signals comprise EDGE signals.

20. A system as claimed in claim 1, wherein said signals comprise multi carrier signals.

21. A system as claimed in claim 1, wherein said relatively low frequency shorting circuitry is arranged to short circuit at a reference plane of said power transistor.

22. A transmitter comprising a power amplifier system as claimed in claim 1.

23. An integrated circuit comprising:
 input means for receiving a signals at a plurality of different frequencies;
 a power transistor for amplifying received signals;
 first circuitry connected at one end to said power amplifier and at another end to a relatively low frequency shorting circuitry, said first circuitry being such that said another end is an open circuit to said different frequencies, said first circuitry comprising a short circuit at signal envelope frequencies thereby causing said first circuitry to have a length which is substantially less than a quarter wavelength of said different frequencies.

* * * * *